(12) United States Patent
Kim

(10) Patent No.: US 10,579,759 B2
(45) Date of Patent: Mar. 3, 2020

(54) APPARATUS FOR MODELING RESISTIVE MEMORY DEVICES

(71) Applicant: SK hynix Inc., Icheon-si, Gyeonggi-do (KR)

(72) Inventor: Sung Soo Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 352 days.

(21) Appl. No.: 15/200,146

(22) Filed: Jul. 1, 2016

(65) Prior Publication Data

US 2017/0199954 A1 Jul. 13, 2017

(30) Foreign Application Priority Data

Jan. 11, 2016 (KR) .................. 10-2016-0003052

(51) Int. Cl.
G06F 11/22 (2006.01)
G06F 17/50 (2006.01)

(52) U.S. Cl.
CPC ................ *G06F 17/5036* (2013.01)

(58) Field of Classification Search
CPC .................................. G06F 17/5036
See application file for complete search history.

(56) References Cited

U.S. PATENT DOCUMENTS

| | | | | |
|---|---|---|---|---|
| 2010/0103722 A1* | 4/2010 | Nirschl | ............... | G11C 13/0004 365/163 |
| 2011/0051511 A1* | 3/2011 | Baker | ............... | G11C 7/02 365/185.03 |
| 2011/0103150 A1* | 5/2011 | Chan | ............... | G11C 16/0483 365/185.19 |

OTHER PUBLICATIONS

Amit Krishna Dwivedi et al. "Characterization of Phase-Change Material using Verilog-A and its Validation as a Memory Element" (Year: 2014).*

(Continued)

*Primary Examiner* — Timothy A Mudrick
*Assistant Examiner* — Abdou K Seye
(74) *Attorney, Agent, or Firm* — William Park & Associates Ltd.

(57) ABSTRACT

An apparatus for modeling a resistive memory device may include a first model circuit and a second model circuit. The first model circuit may include a current-voltage characteristic-embodying circuit, a phase-expressing circuit, and a characteristic-expressing circuit. The current-voltage characteristic-embodying circuit may generate current-voltage characteristic data of the resistive memory device. The phase-expressing circuit may generate phase-expressing data for changing phases of the resistive memory device. The characteristic-expressing circuit may be configured to generate characteristic-expressing data for identifying resistance variation characteristics of the resistive memory device. The characteristic-expressing circuit may transmit the characteristic-expressing data to the current-voltage characteristic-embodying circuit. The second model circuit may include a state-maintaining circuit with a resistive memory device model. The state-maintaining circuit may determine data storage phase in response to the phase-expressing data. The second model circuit may transmit a voltage signal of the state-maintaining circuit to the current-voltage characteristic-embodying circuit.

12 Claims, 5 Drawing Sheets

(56) References Cited

OTHER PUBLICATIONS

Li Xi et al., "An SPICE model for phase-change memory simulations," Journal of Semiconductors, Sep. 2011, pp. 094011-1-094011-4, vol. 32 No. 9, Chinese Institute of Electronics.
Yi-Bo Laio et al., "Phase Change Memory Modeling Using Verilog-A," 2007 IEEE International Behavioral Modeling and Simulation Workshop, Sep. 20-21, 2007, pp. 159-164, IEEE.
The 23rd Korean Conference on Semiconductors, Feb. 22-24, 2016.

* cited by examiner

APPARATUS FOR MODELING RESISTIVE MEMORY DEVICES

CROSS-REFERENCES TO RELATED APPLICATION

The present application claims priority under 35 U.S.C. § 119(a) to Korean application number 10-2016-0003052 filed on Jan. 11, 2016, in the Korean Intellectual Property Office, which is incorporated herein by reference in its entirety.

BACKGROUND

1. Technical Field

Various embodiments generally relate to an apparatus for modeling a semiconductor device, and more particularly to an apparatus for modeling a resistive memory device.

2. Related Art

Examples of a phase-changeable memory device may include a resistive memory device. The resistive memory device has many advantages over a DRAM device and a flash memory device.

Operation modes of a semiconductor memory device such as the resistive memory device may include a program (write) mode for storing data in a memory cell, and a read mode for reading the data from the memory cell. The operation modes of the semiconductor memory device may further include an erase mode for erasing the data stored in the memory cell to initialize the memory cell.

A common method of designing a semiconductor memory device requires considering various characteristics such as operational characteristics that may vary depending on the operation modes, characteristics of fabrication processes, structural characteristics, etc. The semiconductor memory device that stores and reads data effectively can be only realized by designing it based on the characteristics thereof.

SUMMARY

In an embodiment, an apparatus for modeling a resistive memory device may include a first model circuit and a second model circuit. The first model circuit may include a current-voltage characteristic-embodying circuit, a phase-expressing circuit, and a characteristic-expressing circuit. The current-voltage characteristic-embodying circuit may generate current-voltage characteristic data of the resistive memory device. The phase-expressing circuit may generate phase-expressing data for changing phases of the resistive memory device. The characteristic-expressing circuit may be configured to generate characteristic-expressing data for identifying resistance variation characteristics of the resistive memory device. The characteristic-expressing circuit may transmit the characteristic-expressing data to the current-voltage characteristic-embodying circuit. The second model circuit may include a state-maintaining circuit with a resistive memory device model. The state-maintaining circuit may determine data storage phase in response to the phase-expressing data. The second model circuit may transmit a voltage signal of the state-maintaining circuit to the current-voltage characteristic-embodying circuit.

DETAILED DESCRIPTION

Figure 1:
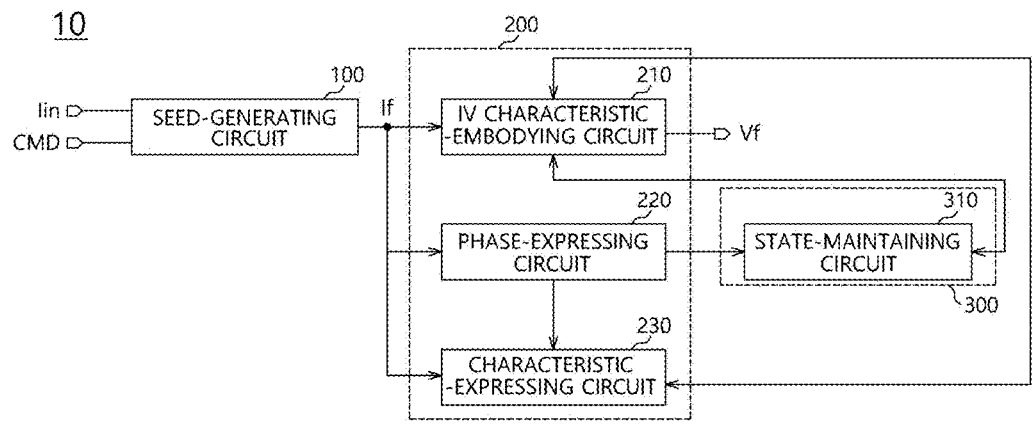
FIG. 1 is a diagram illustrating an example of an apparatus for modeling a resistive memory device in accordance with example embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a diagram illustrating an example of an apparatus for modeling a resistive memory device in accordance with example embodiments.

Referring to FIG. 1, an apparatus 10 for modeling a resistive memory device may include a seed-generating circuit 100, a first model circuit 200, and a second model circuit 300.

The seed-generating circuit 100 may generate a modeling current If in response to an input current Iin and a control command CMD. In example embodiments, the modeling current If generated from the seed-generating circuit 100 may have a level for generating phase-expressing data or characteristic-expressing data in response to the control command CMD.

The first model circuit 200 may generate, in response to the modeling current If, current-voltage (I-V) characteristic data Vf of the resistive memory device, the phase-expressing data for changing phases of the resistive memory device, and the characteristic-expressing data for identifying resistance variation characteristics of the resistive memory device.

In example embodiments, the first model circuit 200 may include an I-V characteristic-embodying circuit 210, a phase-expressing circuit 220, and a characteristic-expressing circuit 230. The I-V characteristic-embodying circuit 210 may generate I-V characteristic data. The phase-expressing circuit 220 may generate phase-expressing data. The characteristic-expressing circuit 230 may generate characteristic-expressing data.

The second model circuit 300 may be a resistive memory device model, and may include a state-maintaining circuit 310. The state-maintaining circuit 310 may include a digital circuit that stores logic-high data or logic-low data. In example embodiments, the state-maintaining circuit 310 may include an RS Flip-Flop circuit. Alternatively, the state-maintaining circuit 310 may include other circuits that can store digital data. In example embodiments, the state-maintaining circuit 310 may include a single level cell (SLC) model which stores a single data of "0" or "1" in a single memory cell. Alternatively, the state-maintaining circuit 310 may further include a plurality of digital circuits as the resistive memory device model. In this case, the state-maintaining circuit 310 may include a multi-level cell (MLC) model which stores at least two data in the single cell.

When the resistive memory device may include a passive circuit model, for example, a capacitive circuit model, it may be difficult to accurately model the resistive memory device due to external environment conditions. However, because the second model circuit 300 of this example embodiment may include the digital circuit such as the RS Flip-Flop circuit, it may be possible to accurately model the resistive memory device without considering the external environment conditions such as a load capacitance.

The second model circuit 300 may provide the I-V characteristic-embodying circuit 210 with the voltage signal of the state-maintaining circuit 310. The I-V characteristic-embodying circuit 210 may model I-V characteristics of the second model circuit 300.

Figure 2:
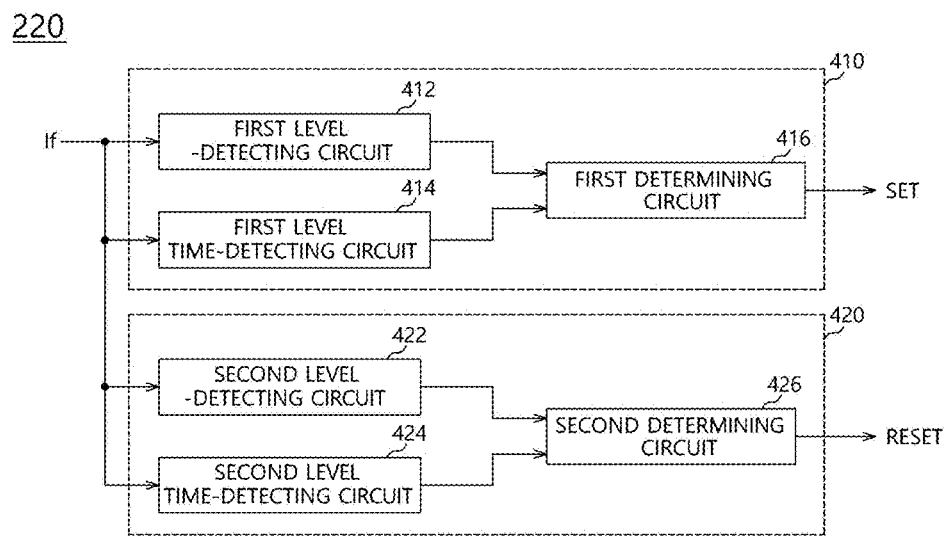
FIG. 2 is a diagram illustrating an example of a phase-expressing circuit in accordance with example embodiments.

FIG. 2 is a diagram illustrating an example of a phase-expressing circuit in accordance with example embodiments.

Referring to FIG. 2, the phase-expressing circuit 220 may generate the phase-expressing data for changing data storage phases of the second model circuit 300, which is the resistive memory device model. The phase-expressing circuit 220 may include a first phase-expressing circuit 410 and a second phase-expressing circuit 420.

The first phase-expressing circuit 410 may generate first data SET for changing the data storage phase of the state-maintaining circuit 310 of the second model circuit 300 into a first phase. The second phase-expressing circuit 420 may generate second data RESET for changing the data storage phase into a second phase in the state-maintaining circuit 310 of the second model circuit 300.

In example embodiments, the first phase-expressing circuit 410 may generate the first data SET for modeling a low-resistance phase, for example, a set SET state or a logic-low-level state through the state-maintaining circuit 310. The second phase-expressing circuit 420 may generate the second data RESET for modeling a high-resistance phase, for example, a reset RESET state or a logic-high-level state through the state-maintaining circuit 310.

The first phase-expressing circuit 410 may include a first level-detecting circuit 412, a first time-detecting circuit 414, and a first determining circuit 416.

The first level-detecting circuit 412 may detect whether a level of the modeling current If is equal to or greater than a predetermined first level C1 or not. In example embodiments, when the level of the modeling current If is equal to or greater than the first level C1, the first level-detecting circuit 412 may output a first level-detecting signal having a predetermined logic level.

The first time-detecting circuit 414 may detect whether a quenching time of the modeling current If is within a predetermined first time or not. In example embodiments, when the quenching time of the modeling current If is within the first time, the first time-detecting circuit 414 may output a first time-detecting signal having a predetermined logic level.

The first determining circuit 416 may generate the first data SET for providing the state-maintaining circuit 310 with the low-resistance phase in response to the first level-detecting signal of the first level-detecting circuit 412 and the first time-detecting signal of the first time-detecting circuit 414. In example embodiments, when the level of the modeling current If is equal to or greater than the first level C1 and the quenching time of the modeling current If is within the first time, the first determining circuit 416 may generate the first data SET. The state-maintaining circuit 310 may store the logic data, for example, the logic-low data corresponding to the low-resistance phase in response to the first data SET.

The second phase-expressing circuit 420 may include a second level-detecting circuit 422, a second time-detecting circuit 424 and a second determining circuit 426.

The second level-detecting circuit 422 may detect whether the level of the modeling current If is equal to or greater than a predetermined second level C2 or not. In example embodiments, when the level of the modeling current If is equal to or greater than the second level C2, the second level-detecting circuit 422 may output a second level-detecting signal having a predetermined logic level. The second level C2 may be higher than the first level C1.

The second time-detecting circuit 424 may detect whether the quenching time of the modeling current If is within a predetermined second time or not. In example embodiments, when the quenching time of the modeling current If is within the second time, the second time-detecting circuit 424 may output a second time-detecting signal having a predetermined logic level.

The second determining circuit 426 may generate the second data RESET so that the state-maintaining circuit 310 has the high-resistance phase in response to the second level-detecting signal of the second level-detecting circuit 422 and the second time-detecting signal of the second time-detecting circuit 424. In example embodiments, when the level of the modeling current If is equal to or greater than the second level C2 and the quenching time of the modeling current If is within the second time, the second determining circuit 426 may generate the second data RESET. In response to the second data RESET, the state-maintaining circuit 310 may store the logic data corresponding to the high-resistance phase, for example, logic-high data.

In example embodiments, the first time-detecting circuit 414 and the second time-detecting circuit 424 may detect the quenching time of the modeling current If by measuring a slope of the modeling current If during a predetermined time period. The slope of the modeling current If may be measured by a slope calculation method, a differentiation method, etc.

In example embodiments, the first determining circuit 416 and the second determining circuit 426 may include a logic combination circuit such as an AND logic circuit that generates output signals by combining logic levels of input signals, but are not limited thereto.

If the output signal SET of the first phase-expressing circuit 410 is enabled, the logic data stored in the state-maintaining circuit 310 may be converted into the first data. If the output signal RESET of the second phase-expressing circuit 420 is enabled, the logic data stored in the state-maintaining circuit 310 may be converted into the second data. That is, the state-maintaining circuit 310 may change the data storage phase only when the level and the quenching time of the modeling current If meets phase transition conditions.

Figure 3:
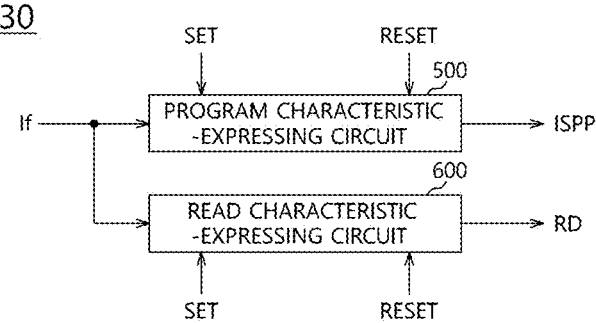
FIG. 3 is a diagram illustrating an example of a characteristic-expressing circuit in accordance with example embodiments.

FIG. 3 is a diagram illustrating an example of a characteristic-expressing circuit in accordance with example embodiments.

The characteristic-expressing circuit 230 may generate the characteristic-expressing data for identifying resistance variation characteristics of the resistive memory device. The characteristic-expressing circuit 230 may include a program characteristic-expressing circuit 500 and a read characteristic-expressing circuit 600.

The program characteristic-expressing circuit 500 may receive the modeling current If. The program characteristic-expressing circuit 500 may generate program characteristic-expressing data ISPP representing the resistance variation characteristics when a program operation is performed in response to the output signal of the phase-expressing circuit 220. The program characteristic-expressing data ISPP may be transmitted to the I-V characteristic-embodying circuit 210. The I-V characteristic-embodying circuit 210 may model I-V characteristics when the program is performed using the ISPP.

The read characteristic-expressing circuit 600 may receive the modeling current If. The read characteristic-expressing circuit 600 may generate read characteristic-expressing data representing the resistance variation characteristics when a read process is performed in response to the output signal of the phase-expressing circuit 220. For example, examples of the resistance variation characteristics when a read process is performed may include a read disturbance (RD). The read characteristic-expressing data (e.g., read disturbance RD) may be transmitted to the I-V characteristic-embodying circuit 210. The I-V characteristic-embodying circuit 210 may model I-V characteristics according to repeated read operations.

The program process of the resistive memory device may be performed in an Incremental Step Pulse Program (ISPP) manner. The ISSP may improve a threshold voltage distribution when the resistive memory device is programmed. The ISSP may gradually increase a program current to program a selected memory cell. A read margin may be improved by narrowing the threshold voltage distribution of the resistive memory device.

When the program current is gradually increased to repeatedly program the resistive memory device, in order to identify the resistance variation characteristics of the resistive memory device, the program operations using the ISSP may be modeled by the program characteristic-expressing circuit 500.

Figure 4:
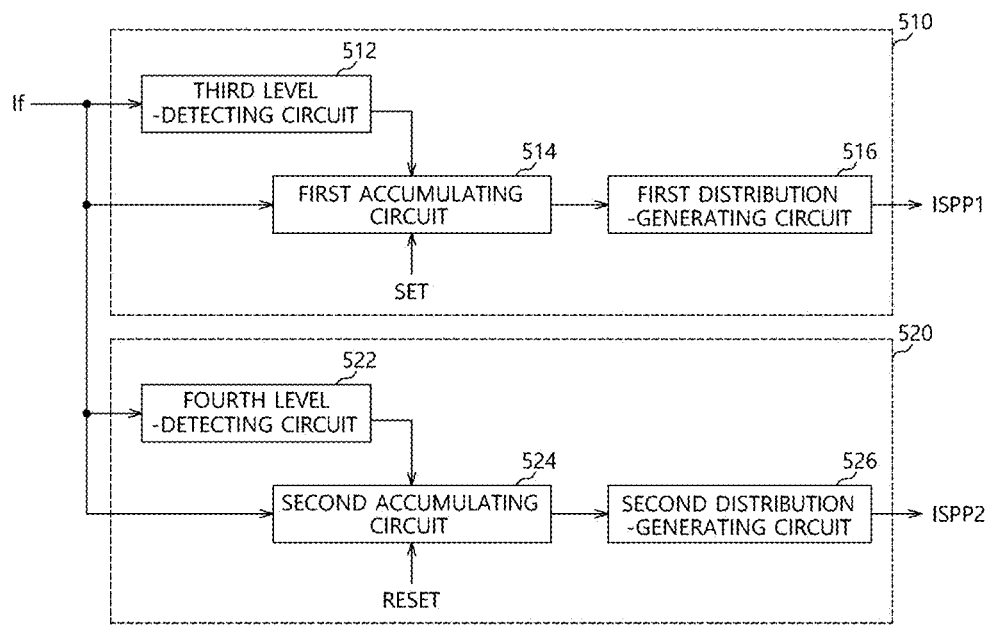
FIG. 4 is a diagram illustrating an example of a program characteristic-expressing circuit in accordance with example embodiments.

FIG. 4 is a diagram illustrating an example of a program characteristic-expressing circuit in accordance with example embodiments.

Referring to FIG. 4, the program characteristic-expressing circuit 500 may include a first program characteristic-expressing circuit 510 and a second program characteristic-expressing circuit 520.

When the first data SET is programmed in the state-maintaining circuit 310 of the second model circuit 300 by the ISSP manner, the first program characteristic-expressing circuit 510 may generate first distribution data ISPP1 representing a relation between an accumulated value of the modeling current If and a cell threshold voltage.

In example embodiments, the first program characteristic-expressing circuit 510 may include a third level-detecting circuit 512, a first accumulating circuit 514, and a first distribution-generating circuit 516.

The third level-detecting circuit 512 may detect whether the level of the modeling current If is equal to or greater than a predetermined level, for example, the first level C1 or not.

The first accumulating circuit 514 may accumulate the modeling current If applied per a program cycle in response to an output signal of the third level-detecting circuit 512 and the output signal SET of the first phase-expressing circuit 410. The first accumulating circuit 514 may continuously operate while the first data SET is being enabled. That is, when the output signal of the third level-detecting circuit 512 is enabled, the first accumulating circuit 514 may accumulate the modeling current If. In contrast, when the first data SET may be disabled, the first accumulating circuit 514 may be initialized.

The first distribution-generating circuit 516 may generate the first distribution data ISPP1 representing a relationship between an accumulated value of the modeling current If generated by the first accumulating circuit 514 and the cell threshold voltage. In example embodiments, the first distribution-generating circuit 516 may generate the accumulated value of the modeling current If calculated by the first accumulating circuit 514 as a Gaussian random distribution function.

In example embodiments, the second program characteristic-expressing circuit 520 may include a fourth level-detecting circuit 522, a second accumulating circuit 524, and a second distribution-generating circuit 526.

The fourth level-detecting circuit 522 may detect whether the level of the modeling current If is equal to or greater than a predetermined level, for example, the second C2 or not.

The second accumulating circuit 524 may accumulate the modeling current If applied per a program cycle in response to an output signal of the fourth level-detecting circuit 522 and the output signal RESET of the second phase-expressing circuit 420. The second accumulating circuit 524 may continuously operate while the second data RESET is being enabled. That is, when the output signal of the fourth level-detecting circuit 522 is enabled, the second accumulating circuit 524 may accumulate the modeling current If. In contrast, when the second data RESET is disabled, the second accumulating circuit 524 may be initialized.

The second distribution-generating circuit 526 may generate the second distribution data ISPP2 representing a relationship between an accumulated value of the modeling current If generated by the second accumulating circuit 524 and the cell threshold voltage. In example embodiments, the second distribution-generating circuit 526 may generate the accumulated value of the modeling current If calculated by the second accumulating circuit 524 as a Gaussian random distribution function.

Therefore, when the first data SET is programmed in the state-maintaining circuit 310 by the ISSP manner, the cell threshold voltage distribution with respect to the accumulated value of the modeling current If applied to the state-maintaining circuit 310 may be recognized based on the first distribution data ISPP1. Further, when the second data RESET is programmed in the state-maintaining circuit 310 by the ISSP manner, the cell threshold voltage distribution with respect to the accumulated value of the modeling current If applied to the state-maintaining circuit 310 may be recognized based on the second distribution data ISPP2.

The resistance of the resistive memory device may change as the resistive memory device repeat the read operations. For example, a minor variation of the threshold voltage in the resistive memory device may be generated in proportion to the number of the repeated read operations. This may be referred to as a read disturbance.

Figure 5:
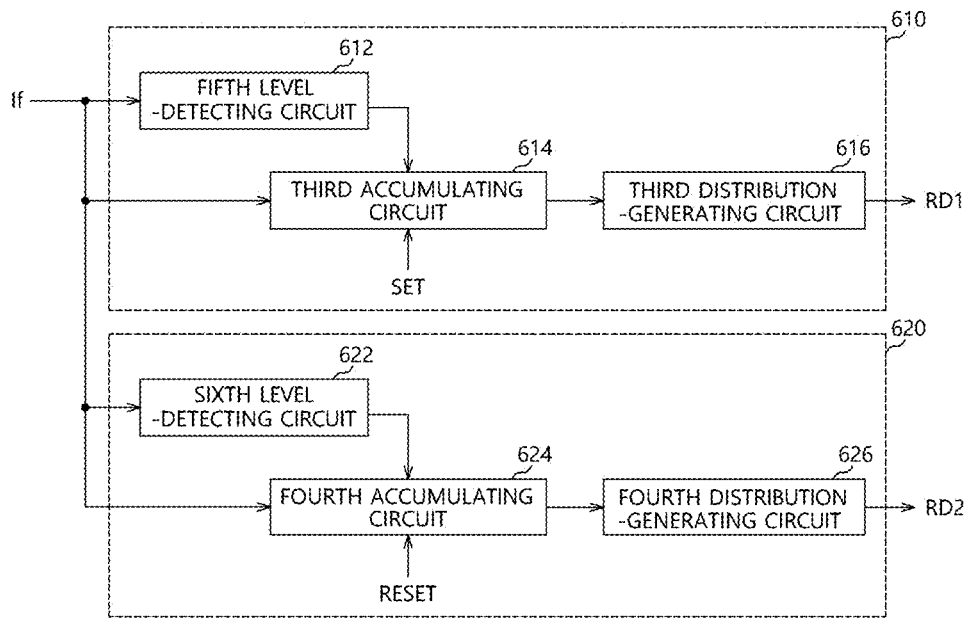
FIG. 5 is a diagram illustrating an example of a read characteristic-expressing circuit in accordance with example embodiments.

FIG. 5 is a diagram illustrating an example of a read characteristic-expressing circuit in accordance with example embodiments.

Referring to FIG. 5, the read characteristic-expressing circuit 600 may identify characteristic variations by the read disturbance. The read characteristic-expressing circuit 600 may include a first read characteristic-expressing circuit 610 and a second read characteristic-expressing circuit 620.

The first read characteristic-expressing circuit 610 may include a fifth level-detecting circuit 612, a third accumulating circuit 614, and a third distribution-generating circuit 616.

The fifth level-detecting circuit 612 may detect whether the level of the modeling current If is equal to or greater than a predetermined level, for example, a first read current level C3 or not in the read operation. The first read current level C3 may be a level capable of reading the first data SET.

The third accumulating circuit 614 may accumulate the modeling current If applied per a program cycle in response to an output signal of the fifth level-detecting circuit 612 and the output signal RESET of the first phase-expressing circuit 410. The third accumulating circuit 614 may continuously operate while the first data SET is being enabled. That is, when the output signal of the fifth level-detecting circuit 612 is enabled, the third accumulating circuit 614 may accumulate the modeling current If. In contrast, when the first data SET is disabled, the third accumulating circuit 614 may be initialized.

The third distribution-generating circuit 616 may generate third distribution data RD1 representing a relationship between an accumulated value of the modeling current If generated by the third accumulating circuit 614 and the cell threshold voltage. In example embodiments, the third distribution-generating circuit 616 may generate the accumulated value of the modeling current If calculated by the third accumulating circuit 616 as a Gaussian random distribution function.

In example embodiments, the second read characteristic-expressing circuit 620 may include a sixth level-detecting circuit 622, a fourth accumulating circuit 624, and a fourth distribution-generating circuit 626.

The sixth level-detecting circuit 622 may detect whether the level of the modeling current If is equal to or greater than a predetermined level, for example, a second read current level C4 or not in the read operation. The second read current level C4 may be a level capable of reading the second data RESET.

The fourth accumulating circuit 624 may accumulate the modeling current If applied by the program cycle in response to an output signal of the sixth level-detecting circuit 622 and the output signal RESET of the second phase-expressing circuit 420. The fourth accumulating circuit 624 may continuously operate while the second data RESET is being enabled. That is, when the output signal of the sixth level-detecting circuit 622 may be enabled, the fourth accumulating circuit 624 may accumulate the modeling current If. In contrast, when the second data RESET may be disabled, the fourth accumulating circuit 624 may be initialized.

The fourth distribution-generating circuit 626 may generate the fourth distribution data RD2 representing a relationship between an accumulated value of the modeling current If generated by the fourth accumulating circuit 624 and the cell threshold voltage. In example embodiments, the fourth distribution-generating circuit 626 may generate the accumulated value of the modeling current If calculated by the fourth accumulating circuit 624 as a Gaussian random distribution function.

When the read operation is modeled in a situation where the first data SET is stored in the state-maintaining circuit 310, the third distribution data RD1, which may be based on the accumulated value of the modeling current If applied by the read cycles, may be generated. This operation may be maintained until the data storage phase of the state-maintaining circuit 310 changes. Further, when the read operation is modeled in a situation where the second data RESET is stored in the state-maintaining circuit 310, the fourth distribution data RD2, which may be based on the accumulated value of the modeling current If applied by the read cycles, may be generated. This operation may be maintained until the data storage phase of the state-maintaining circuit 310 changes. As a result, the read disturbance caused by the repeated read cycle may be modeled through the first and second read characteristic-expressing circuits 510 and 610.

Figure 6:
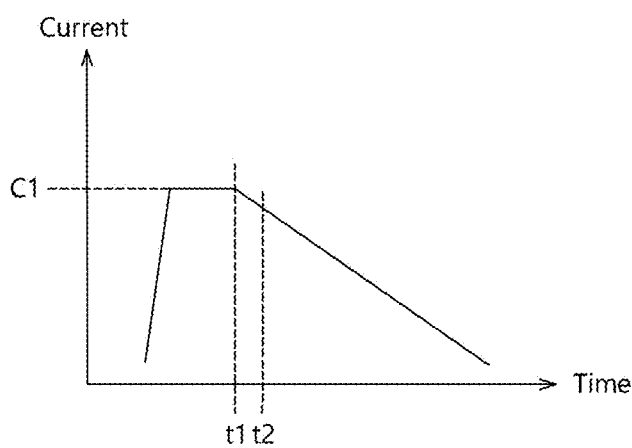
FIGS. 6 and 7 are graphs illustrating examples of operations of a phase-embodying circuit in accordance with example embodiments.
Figure 7:
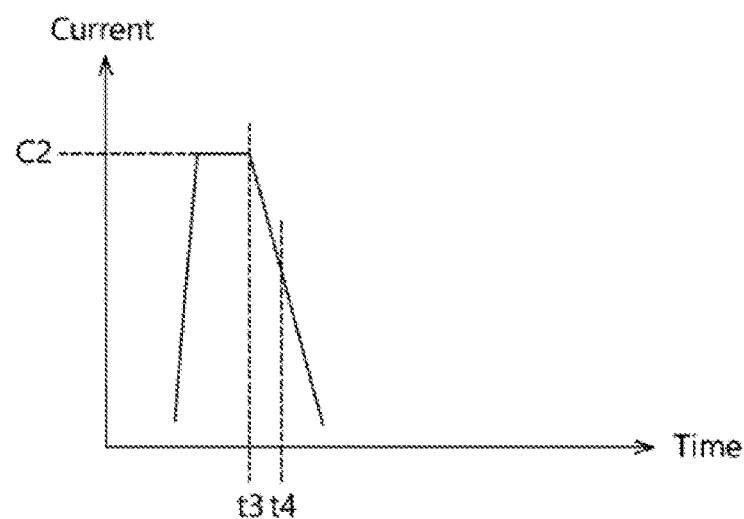

FIGS. 6 and 7 are graphs illustrating examples of operations of a phase-embodying circuit in accordance with example embodiments.

Referring to FIGS. 6 and 7, the phase-expressing circuit 220 may detect what kind of the modeling current If is being applied to program the state-maintaining circuit 310 to store the first data SET or the second data RESET.

When the modeling current If in FIG. 6 is supplied, the first level-detecting circuit 412 may detect whether the level of the modeling current If is equal to or greater than the first level C1 or not. The first time-detecting circuit 414 may detect whether the quenching time of the modeling current If is within the first time or not. The detecting operations may generate the first data SET. In example embodiments, the first time-detecting circuit 414 may detect the quenching time of the modeling current If by measuring a slope of the modeling current If during a period t1-t2.

When the modeling current If in FIG. 7 is supplied, the second level-detecting circuit 422 may detect whether the level of the modeling current If is equal to or greater than the second level C2 or not. The second time-detecting circuit 424 may detect whether the quenching time of the modeling current If is within the second time or not. The detecting operations may generate the second data RESET. In example embodiments, the second time-detecting circuit 424 may detect the quenching time of the modeling current If by measuring a slope of the modeling current If during a period t3-t4.

Therefore, desired model data may be programmed in the state-maintaining circuit 310 in accordance with the level and the quenching time of the modeling current If supplied when the program operation is modeled.

Figure 8:
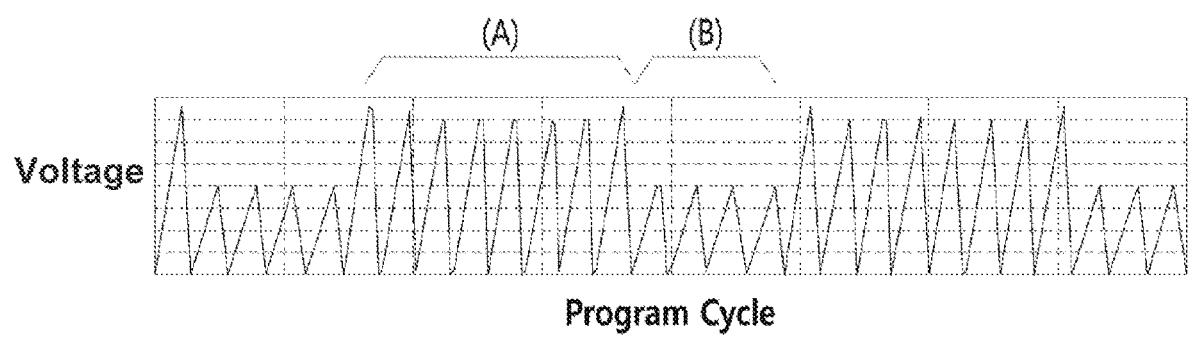
FIGS. 8 and 9 are graphs illustrating examples of operations of a characteristic-expressing circuit in accordance with example embodiments.
Figure 9:
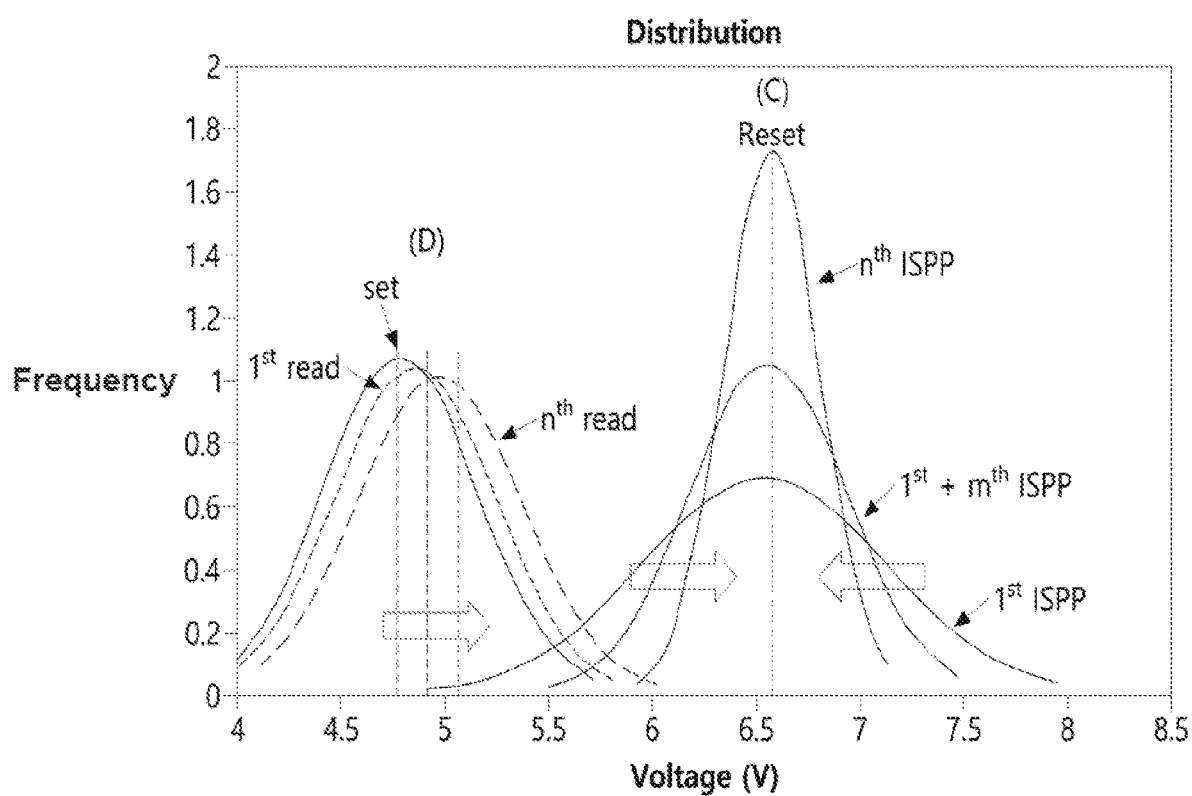

FIGS. 8 and 9 are graphs illustrating examples of operations of a characteristic-expressing circuit in accordance with example embodiments.

Referring to FIGS. 8 and 9, the program characteristic-expressing circuit 500 of the characteristic-expressing circuit 200 may generate the program characteristic-expressing data ISSP representing the relation between the accumulated value of the program current and the cell threshold voltage applied when the first data SET and the second data RESET is programmed by the ISSP manner. The program characteristic-expressing data ISSP may include the first distribution data ISSP1 and the second distribution data ISSP2.

When a process A for programming the second data RESET may be modeled as shown in FIG. 8, the program characteristic-expressing circuit 500 may generate the program characteristic-expressing data C in FIG. 9. Referring to FIG. 9, it can be noted that the threshold voltage distribution of the cell may be narrowed in proportion to the increase in the number of the supply of the modeling current If for the program operation, i.e., the threshold voltage distribution of the cell may be narrowed as the program cycle is repeated.

The read characteristic-expressing circuit 600 of the characteristic-expressing circuit 200 may generate the read characteristic-expressing data RD representing the relation between the accumulated value of the read current and the cell threshold voltage in accordance with the repetition of the read cycle when the first data SET or the second data RESET in the state-maintaining circuit 310 is read.

When the read cycle B in FIG. 8 is repeated in a situation where the first data SET is stored in the state-maintaining circuit 310, the read characteristic-expressing circuit 600 may generate the read characteristic-expressing data D as illustrated in FIG. 9. Referring to FIG. 9, it can be noted that the threshold voltage of the cell may be increased in proportion to the increase in the number of the modeling current If for the read operation, i.e., the threshold voltage of the cell may increase as the read cycle is repeated.

According to example embodiments, the second model circuit 300 as the resistive memory device model may be embodied using the digital circuit. The I-V characteristics of the second model circuit 300 may be recognized through the first model circuit 200 when the program operation or the read operation is performed with respect to the second model circuit 300. The first model circuit 200 may store (i.e., program) the first data SET or the second data RESET in the second model circuit 300 in accordance with the shape of the graph of the modeling current If. Further, the ISSP-type modeling may be performed when the program operation is modeled. Furthermore, the read disturbance may be modeled when the read operation is modeled.

The first and second model circuits 200 and 300 may be based on a Verilog-A language. The first and second model circuits 200 and 300 may include a SPICE simulator based the Verilog-A.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. An apparatus for modeling a resistive memory device, the apparatus comprising:
   a first model circuit including:
      a current-voltage (I-V) characteristic-embodying circuit generating I-V characteristic data of the resistive memory device in response to a modeling current;
      a phase-expressing circuit configured to generate a first phase-expressing data when a level of the modeling current is equal to or greater than a first level and a quenching time of the modeling current is within a first time;
      a second phase-expressing circuit configured to generate a second phase-expressing data when the level of the modeling current is equal to or greater than a second level higher than the first level and a quenching time of the modeling current is within a second time wider than the first time; and
      a first program characteristic-expressing circuit operating in response to the first phase-expressing data and configured to generate first distribution data representing the relation between the accumulated value of the modeling current applied in an Incremental Step Pulse Program (ISPP) manner by the program cycles and the threshold voltage of the resistive memory device and to provide the first distribution data to the I-V characteristic-embodying circuit;
      a second model circuit including a state-maintaining circuit with a resistive memory device model, the second model circuit having data storage phases determinable in response to the phase-expressing data, the second model circuit providing a voltage signal of the state-maintaining circuit to the I-V characteristic-embodying circuit.

2. The apparatus of claim 1, wherein
   the first phase-expressing circuit is configured to generate the first phase-expressing data for changing the data storage phase into a first phase in the second model circuit, and
   wherein a second phase-expressing circuit is configured to generate the second phase-expressing data for changing the data storage phase into a second phase in the second model circuit.

3. The apparatus of claim 1, wherein the first phase-expressing circuit is configured to detect the quenching time of the modeling current by measuring a slope of the modeling current during a predetermined period.

4. The apparatus of claim 1, wherein the second phase-expressing circuit is configured to detect the quenching time of the modeling current by measuring a slope of the modeling current during a predetermined period.

5. The apparatus of claim 1, wherein the apparatus further comprises a read characteristic-expressing circuit configured to generate read characteristic-expressing data representing resistance variation characteristics of the resistive memory device in a read operation in response to the modeling current and an output signal of the phase-expressing circuit.

6. The apparatus of claim 1, wherein the apparatus further comprises a second program characteristic-expressing circuit operating in response to second phase-expressing data and configured to generate second distribution data representing the relation between the accumulated value of the modeling current applied in an Incremental Step Pulse Program (ISPP) manner per a program cycles and the threshold voltage of the resistive memory device and to provide the second distribution data to the I-V characteristic-embodying circuit.

7. The apparatus of claim 1, wherein the characteristic-expressing circuit further comprises a read characteristic-expressing circuit configured to generate read characteristic-expressing data representing a relation between an accumulated value of the modeling current applied per a read cycle and a threshold voltage of the resistive memory device and to provide the read characteristic-expressing data to the I-V characteristic-embodying circuit.

8. The apparatus of claim 7, wherein the read characteristic-expressing circuit comprises a first read characteristic-expressing circuit operating in response to first phase-expressing data generated from the phase-expressing circuit and configured to generate third distribution data representing the relation between the accumulated value of the modeling current applied per a read cycle and the threshold voltage of the resistive memory device when a level of the modeling current is equal to or greater than a first level and a quenching time of the modeling current is within the first time and to provide the third distribution data to the I-V characteristic-embodying circuit.

9. The apparatus of claim 7, wherein the read characteristic-expressing circuit comprises a second read characteristic-expressing circuit operating in response to second phase-expressing data generated from the phase-expressing circuit and configured to generate fourth distribution data representing the relation between the accumulated value of the modeling current applied by the read cycles and the threshold voltage of the resistive memory device when a level of the modeling current is equal to or greater than the second level higher than the first level and a quenching time of the modeling current is within the second time a window of which is wider than that of the first time and to provide the fourth distribution data to the I-V characteristic-embodying circuit.

10. The apparatus of claim 1, wherein the second model circuit comprises a digital circuit.

11. The apparatus of claim 1, wherein the second model circuit comprises at least one RS Flip Flop.

12. The apparatus of claim 1, wherein the first model circuit and the second model circuit comprise a simulator based a Verilog-A language.

* * * * *